(12) United States Patent
Snis

(10) Patent No.: US 9,897,513 B2
(45) Date of Patent: Feb. 20, 2018

(54) ENERGY BEAM SIZE VERIFICATION

(71) Applicant: ARCAM AB, Moelndal (SE)

(72) Inventor: Anders Snis, Uddevalla (SE)

(73) Assignee: ARCAM AB, Moelndal (SE)

( * ) Notice: Subject to any disclaimer, the term of this patent is extended or adjusted under 35 U.S.C. 154(b) by 0 days.

(21) Appl. No.: 15/495,318

(22) Filed: Apr. 24, 2017

(65) Prior Publication Data
US 2017/0227417 A1 Aug. 10, 2017

Related U.S. Application Data

(63) Continuation of application No. 15/077,155, filed on Mar. 22, 2016, now Pat. No. 9,664,504, which is a
(Continued)

(51) Int. Cl.
*G01J 5/02* (2006.01)
*G01M 11/02* (2006.01)
(Continued)

(52) U.S. Cl.
CPC ......... *G01M 11/02* (2013.01); *B23K 15/0013* (2013.01); *B23K 15/0086* (2013.01);
(Continued)

(58) Field of Classification Search
CPC .................................................... H01J 29/52
See application file for complete search history.

(56) References Cited

U.S. PATENT DOCUMENTS 2,264,968 A 12/1941 De Forest
2,323,715 A 7/1943 Kuehni
(Continued)

FOREIGN PATENT DOCUMENTS

CA 2860188 A1 6/2006
CN 101607311 A 12/2009
(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.
(Continued)

*Primary Examiner* — Kiho Kim
(74) *Attorney, Agent, or Firm* — Alston & Bird LLP

(57) ABSTRACT

A method for verifying a size of an energy beam spot, said method comprising the steps of providing a first beam spot having a predetermined size and power at a first position on a work piece, varying a focus and/or astigmatism lens setting for said first beam spot until max intensity for the beam spot is detected, comparing the detected settings of said focus lens and/or astigmatism lens for said maximum intensity of the beam spot with stored settings of said focus lens and/or astigmatism lens for the beam spot with said predetermined size and power, repeating step a-c for different predetermined beam powers, repeating step a-d for different positions on said work piece, wherein said beam spot size is verified if each detected settings of said focus lens and/or astigmatism lens are deviating less than a predetermined value from corresponding stored settings of said focus lens and/or astigmatism lens.

20 Claims, 7 Drawing Sheets

Related U.S. Application Data continuation of application No. 14/750,779, filed on Jun. 25, 2015, now Pat. No. 9,347,770.

(60) Provisional application No. 62/039,626, filed on Aug. 20, 2014, provisional application No. 62/093,882, filed on Dec. 18, 2014, provisional application No. 62/097,328, filed on Dec. 29, 2014.

(51) Int. Cl.

| | |
|---|---|
| *B23K 15/00* | (2006.01) |
| *B23K 26/03* | (2006.01) |
| *B23K 26/342* | (2014.01) |
| *B23K 26/046* | (2014.01) |
| *B23K 15/02* | (2006.01) |
| *B33Y 50/02* | (2015.01) |
| *H01J 37/244* | (2006.01) |

(52) U.S. Cl.
CPC ............ *B23K 15/02* (2013.01); *B23K 26/032* (2013.01); *B23K 26/046* (2013.01); *B23K 26/342* (2015.10); *B33Y 50/02* (2014.12); *H01J 37/244* (2013.01)

(56) References Cited

U.S. PATENT DOCUMENTS

| | | |
|---|---|---|
| 3,634,644 A | 1/1972 | Ogden et al. |
| 3,838,496 A | 10/1974 | Kelly |
| 3,882,477 A | 5/1975 | Mueller |
| 4,314,134 A | 2/1982 | Schumacher et al. |
| 4,348,576 A | 9/1982 | Anderl et al. |
| 4,352,565 A | 10/1982 | Rowe et al. |
| 4,401,719 A | 8/1983 | Kobayashi et al. |
| 4,541,055 A | 9/1985 | Wolfe et al. |
| 4,818,562 A | 4/1989 | Arcella et al. |
| 4,863,538 A | 9/1989 | Deckard |
| 4,888,490 A | 12/1989 | Bass et al. |
| 4,927,992 A | 5/1990 | Whitlow et al. |
| 4,958,431 A | 9/1990 | Clark et al. |
| 4,988,844 A | 1/1991 | Dietrich et al. |
| 5,118,192 A | 6/1992 | Chen et al. |
| 5,135,695 A | 8/1992 | Marcus |
| 5,167,989 A | 12/1992 | Dudek et al. |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A * | 1/1996 | Giedt .................. G01T 1/29 219/121.14 |
| 5,511,103 A | 4/1996 | Hasegawa |
| 5,595,670 A | 1/1997 | Mombo Caristan |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,162,378 A | 12/2000 | Bedal et al. |
| 6,419,203 B1 | 7/2002 | Dang |
| 6,537,052 B1 | 3/2003 | Adler |
| 6,554,600 B1 | 4/2003 | Hofmann et al. |
| 6,583,379 B1 | 6/2003 | Meiners et al. |
| 6,676,892 B2 | 1/2004 | Das et al. |
| 6,724,001 B1 | 4/2004 | Pinckney et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 7,003,864 B2 | 2/2006 | Dirscherl |
| 7,020,539 B1 | 3/2006 | Kovacevic et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,452,500 B2 | 11/2008 | Uckelmann |
| 7,537,722 B2 | 5/2009 | Andersson et al. |
| 7,540,738 B2 | 6/2009 | Larsson et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Larsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 8,021,138 B2 | 9/2011 | Green |
| 8,083,513 B2 | 12/2011 | Montero-Escuder et al. |
| 8,187,521 B2 | 5/2012 | Larsson et al. |
| 8,308,466 B2 | 11/2012 | Ackelid et al. |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,310,188 B2 | 4/2016 | Snis |
| 9,505,172 B2 | 11/2016 | Ljungblad |
| 9,550,207 B2 | 1/2017 | Ackelid |
| 2002/0104973 A1 | 8/2002 | Kerekes |
| 2002/0152002 A1 | 10/2002 | Lindemann et al. |
| 2002/0195747 A1 | 12/2002 | Hull et al. |
| 2003/0043360 A1 | 3/2003 | Farnworth |
| 2003/0133822 A1 | 7/2003 | Harryson |
| 2003/0205851 A1 | 11/2003 | Laschutza et al. |
| 2004/0012124 A1 | 1/2004 | Li et al. |
| 2004/0026807 A1 | 2/2004 | Andersson et al. |
| 2004/0084814 A1 | 5/2004 | Boyd et al. |
| 2004/0104499 A1 | 6/2004 | Keller |
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2005/0173380 A1 | 8/2005 | Carbone |
| 2005/0186538 A1 | 8/2005 | Uckelmann |
| 2006/0108712 A1 | 5/2006 | Mattes |
| 2006/0145381 A1 | 7/2006 | Larsson |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1* | 12/2006 | Fukunaga ............... H01J 37/21 250/310 |
| 2007/0074659 A1 | 4/2007 | Wahlstrom |
| 2007/0175875 A1 | 8/2007 | Uckelmann et al. |
| 2007/0179655 A1 | 8/2007 | Farnworth |
| 2007/0182289 A1 | 8/2007 | Kigawa et al. |
| 2007/0298182 A1 | 12/2007 | Perret et al. |
| 2008/0236738 A1 | 10/2008 | Lo et al. |
| 2009/0017219 A1 | 1/2009 | Paasche et al. |
| 2009/0152771 A1 | 6/2009 | Philippi et al. |
| 2009/0206056 A1 | 8/2009 | Xu et al. |
| 2010/0007062 A1 | 1/2010 | Larsson et al. |
| 2010/0260410 A1 | 10/2010 | Taminger et al. |
| 2010/0310404 A1 | 12/2010 | Ackelid |
| 2010/0316856 A1 | 12/2010 | Currie et al. |
| 2011/0061591 A1 | 3/2011 | Stecker |
| 2011/0114839 A1 | 5/2011 | Stecker et al. |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |
| 2011/0293770 A1 | 12/2011 | Ackelid et al. |
| 2011/0293771 A1 | 12/2011 | Oberhofer et al. |
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet et al. |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |

(56) References Cited

U.S. PATENT DOCUMENTS

| | | |
|---|---|---|
| 2013/0055568 A1 | 3/2013 | Dusel et al. |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0300286 A1* | 11/2013 | Ljungblad ............... H01J 29/52 315/30 |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0283610 A1 | 10/2015 | Ljungblad et al. |
| 2015/0283611 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0282248 A1 | 10/2017 | Ljungblad et al. |
| 2017/0294288 A1 | 10/2017 | Lock |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| FR | 2980380 A1 | 3/2013 |
| JP | H05-171423 A | 7/1993 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |

(56) References Cited

FOREIGN PATENT DOCUMENTS

| WO | WO 2015/032590 A2 | 3/2015 |
|---|---|---|
| WO | WO 2015/091813 A1 | 6/2015 |
| WO | WO 2015/142492 A1 | 9/2015 |

OTHER PUBLICATIONS

Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.
United States Patent and Trademark Office, Notice of Allowance for U.S. Appl. No. 15/077,200, dated Feb. 8, 2017, 9 pages, U.S.A.
United States Patent and Trademark Office, Notice of Allowance for U.S. Appl. No. 15/077,155, dated Jan. 20, 2017, 10 pages, U.S.A.
United States Patent and Trademark Office, Notice of Allowance for U.S. Appl. No. 14/750,713, dated Apr. 14, 2016, 7 pages, U.S.A.
United States Patent and Trademark Office, Notice of Allowance for U.S. Appl. No. 14/750,779, dated Apr. 8, 2016, 7 pages, U.S.A.
United States Patent and Trademark Office, Notice of Allowance for U.S. Appl. No. 15/077,155, dated Mar. 24, 2017, 10 pages, U.S.A.
United States Patent and Trademark Office, Notice of Allowance for U.S. Appl. No. 15/077,200, dated Mar. 14, 2017, 11 pages, U.S.A.
United States Patent and Trademark Office, Office Action for U.S. Appl. No. 14/750,752, dated Mar. 7, 2016, 7 pages, U.S.A.
United States Patent and Trademark Office, Office Action for U.S. Appl. No. 14/750,752, dated Feb. 9, 2016, 13 pages, U.S.A.
United States Patent and Trademark Office, Office Action for U.S. Appl. No. 15/077,200, dated Sep. 27, 2016, 17 pages, U.S.A.
United States Patent and Trademark Office, Office Action for U.S. Appl. No. 15/077,155, dated Sep. 27, 2016, 19 pages, U.S.A.
United States Patent and Trademark Office, Office Action for U.S. Appl. No. 14/750,779, dated Mar. 7, 2016, 14 pages, U.S.A.
United States Patent and Trademark Office, Office Action for U.S. Appl. No. 14/750,713, dated Mar. 8, 2016, 7 pages, U.S.A.
Weigel, TH., et al., "Design and Preparation of Polymeric Scaffolds for Tissue Engineering," Expert Rev. Med. Devices, 2006, pp. 835-851, vol. 3, No. 6, XP002691485.
Yang, et al., "The Design of Scaffolds for Use in Tissue Engineering, Part II, Rapid Prototyping Techniques", Tissue Engineering, 2002, pp. 1-11, vol. 8, No. 1, XP002691484.
Gibson, D.W., et al., "Additive Manufacturing Technologies: Rapid Prototyping to Direct Digital Manufacturing", 2010, pp. 126-129, Springer, New York.
Motojima, Seiji, et al., "Chemical Vapor Growth of LaB6 Whiskers and Crystals Having a Sharp Tip", Journal of Crystal Growth, vol. 44, No. 1, Aug. 1, 1978 (Aug. 1, 1978), pp. 106-109.

* cited by examiner

ENERGY BEAM SIZE VERIFICATION

CROSS-REFERENCE TO RELATED APPLICATIONS

This application is a continuation of U.S. Nonprovisional patent application Ser. No. 15/077,155, filed Mar. 22, 2016, which is a continuation of U.S. Nonprovisional patent application Ser. No. 14/750,779, filed Jun. 25, 2015 now U.S. Pat. No. 9,347,770, which application claims priority to and the benefit of U.S. Provisional Patent Application Ser. No. 62/039,626, filed Aug. 20, 2014; U.S. Provisional Patent Application Ser. No. 62/093,882, filed Dec. 18, 2014; and U.S. Provisional Patent Application Ser. No. 62/097,328, filed Dec. 29, 2014; the contents of all of which as are hereby incorporated by reference in their entirety.

BACKGROUND

Related Field

Various embodiments of the present invention relate to a method and associated systems for size verification of a beam spot of an energy beam. Consolidated size and deflection speed verification methods and systems are also provided.

Description of Related Art

Freeform fabrication or additive manufacturing is a method for forming three-dimensional articles through successive fusion of chosen parts of powder layers applied to a worktable. A method and apparatus according to this technique is disclosed in US 2009/0152771.

Such an apparatus may comprise a work table on which the three-dimensional article is to be formed, a powder dispenser, arranged to lay down a thin layer of powder on the work table for the formation of a powder bed, an energy beam source for delivering an energy beam spot to the powder whereby fusion of the powder takes place, elements for control of the energy beam spot over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In order to melt the powder material at specific locations there is a need to inter alia verify the size of the beam spot. One needs to know that different power levels of the energy beam at different areas of the powder bed correspond to the desired beam spot sizes. There is a need in the art for a simple and efficient method for verifying the beam spot size of an energy beam such as a laser beam or an electron beam. Still further, in order to melt the powder material at specific locations there is a need to inter alia verify the deflection speed of the energy beam spot. One needs to know that different deflection speeds at different areas of the powder bed correspond to the desired deflection speeds. There is a need in the art for a simple and efficient method for verifying the deflection speed of an energy beam such as a laser beam or an electron beam.

BRIEF SUMMARY

Having this background, an object of the invention is to provide methods and associated systems for verifying a calibrated beam spot size of an energy beam, which is less complex than prior art methods. The above-mentioned object is achieved by the features according to the claims contained herein.

In a first aspect of the invention it is provided a method for verifying a size of an energy beam spot, the method comprising the steps of: a) providing a first energy beam spot having a predetermined size and power at a first position on a work piece, b) varying a focus and/or astigmatism lens setting for the first energy beam spot until max intensity for the first beam spot is detected, c) comparing at least one setting of the focus lens and/or astigmatism lens for the detected maximum intensity of the first energy beam spot with corresponding stored settings of the focus lens and/or astigmatism lens for the first energy beam spot with the predetermined size and power, d) repeating step a-c for different predetermined beam powers, e) repeating step a-d for different positions on the work piece, wherein the first energy beam spot size is verified if each detected settings of the focus lens and/or astigmatism lens are deviating less than a predetermined value from corresponding stored settings of the focus lens and/or astigmatism lens.

An exemplary and non-limiting advantage of this method is that it is an easy and fast method for verifying the beam spot size with a minimum of special equipment. Another advantage is that it may be performed instantaneous and automatically without any involvement of manual labour.

In various exemplary embodiments of the present invention the predetermined beam spot size is a minimum spot size. Any size of the spot may be verified with the inventive method.

In further various exemplary embodiments of the present invention the repeating step for different positions is performed before the repeating step for different predetermined beam powers. In still another example embodiment the repeating step for different positions is performed after the repeating step for different predetermined beam powers. The exemplary and non-limiting advantage of at least these embodiments is that different beam powers at different positions may be verified with the inventive method to have a given beam spot size.

In various exemplary and non-limiting embodiments of the present invention the energy beam spot is an electron beam spot, and the astigmatism lens and/or focus lens setting is a coil current setting to an astigmatism coil and/or a focus coil respectively.

In various exemplary and non-limiting embodiments of the present invention the energy beam spot is a laser beam spot, and the astigmatism lens and/or focus lens setting is a positioning and/or tilting and/or rotation along and/or at and/or around the optical axis of at least one astigmatism lens and/or at least one focus lens respectively.

An exemplary and non-limiting advantage of these embodiments is that the invention is equally applicable for a laser beam as for an electron beam.

In various exemplary and non-limiting embodiments of the present invention the positions is detected by at least one IR-camera, at least one CCD-camera, at least one digital camera, at least one CMOS camera and/or at least one NIR-camera. An exemplary and non-limiting advantage of this embodiment is that the position of the energy beam may be detected by various kinds of cameras depending on the quality and/or resolution requirement.

In various exemplary and non-limiting embodiments of the present invention the method further comprising a step of sending out a warning signal/message if any one of the detected settings of the focus lens and/or astigmatism lens are deviating more than a predetermined value from corresponding stored settings of the focus lens and/or astigmatism lens. The exemplary and non-limiting advantage of this embodiment is that not only the verification method may be fully automatic but is may also bring attention to a coupled software and/or an operator of any malfunction in the energy beam parameter settings.

In various example embodiment of the present invention the method further comprising the steps of: providing a second energy beam spot having a predetermined size and power at the first position on the work piece, varying a focus and/or astigmatism lens setting for the second energy beam spot until max intensity for the second energy beam spot is detected, comparing the max intensity for the first energy beam spot with the max intensity for the second energy beam spot, wherein the first and second energy beam spots are verified if the max intensity of the first energy beam spot is deviating less than a predetermined value from the max intensity of the second energy beam spot.

An exemplary and non-limiting advantage of this embodiment is that multiple energy beam sources may be verified by just comparing its detected max intensities in a given position with each other. If the deviation of the max intensities from different energy beam sources is larger than a predetermined value the energy bam sources may be given a not verified status.

In various example embodiments of the present invention the first and second energy beam spots have equal maximum beam power. An exemplary and non-limiting advantage of this embodiment is that the verification process may be simplified.

In various example embodiments of the present invention the method further comprises the steps of: providing the first energy beam spot at the first position during a first predetermined time duration where a first intensity is detected, providing the first energy beam spot at the first position during a second predetermined time duration where a second intensity is detected, calculating a ratio between the first and second intensities, wherein the first energy beam spot size and/or beam spot power is verified if the calculated ratio between the first and second intensities is less than a corresponding calibrated ratio. An exemplary and non-limiting advantage of this embodiment is that it provides for a fast and accurate verification of the beam spot size and/or beam spot power.

In various example embodiments of the present invention the step of calculation of the ratio is repeated for different beam powers and/or energy beam spot durations. The exemplary and non-limiting advantage of this embodiment is that numerous energy beam powers and/or energy beam spot durations may be verified quick and accurately.

In another aspect of the present invention it is provided a use of a verifying method according to any one of the example embodiments in an additive manufacturing apparatus in which the energy beam spot is used for fusing powder material layerwise for forming three-dimensional articles. The first and second energy beams may consecutively and/or simultaneously fusing the powder material.

In yet another aspect of the present invention, the method further comprises the step of receiving and storing, within one or more memory storage areas, a model of at least one three-dimensional article; and at least one of the varying, comparing, or repeating steps is performed via execution of one or more computer processors.

In yet another aspect of the present invention, the method is further configured (in addition to verifying size) for verifying a deflection speed of the at least one energy beam spot. In such embodiments, the method further comprises the steps of: generating a predetermined pattern on a work table with the energy beam spot while deflecting the energy beam spot with a first deflection speed; detecting first positions of the energy beam spot on the work table created with the first deflection speed; generating the predetermined pattern on a work table with the energy beam spot while deflecting the energy beam spot with a second deflection speed; detecting second positions of the energy beam spot on the work table created with the second deflection speed; and comparing the first and second positions, wherein the deflection speed is verified if each one of the first positions are deviating less than a predetermined distance from corresponding ones of the second positions.

In yet another aspect of the present invention, a program element is provided. The program element is configured, when executed on a computer, to implement a method comprising the steps of: generating a first energy beam spot from a first energy beam source having a predetermined size and power at a first position on a work piece, varying at least one of a focus lens setting or an astigmatism lens setting for the first energy beam spot until max intensity for the first beam spot is detected, comparing at least one setting of the focus lens and/or astigmatism lens for the detected maximum intensity of the first energy beam spot with corresponding stored settings of the focus lens and/or astigmatism lens for the first energy beam spot with the predetermined size and power, repeating the three steps above for different predetermined beam powers, and repeating the four steps above for different positions on the work piece, wherein the first energy beam spot size is verified if each detected settings of the focus lens and/or astigmatism lens are deviating less than a predetermined value from corresponding stored settings of the focus lens and/or astigmatism lens.

In yet another aspect of the present invention, a non-transitory computer program product comprising at least one non-transitory computer-readable storage medium having computer-readable program code portions embodied therein is provided. The code portions comprise in such embodiments, an executable portion configured for generating a first energy beam spot from a first energy beam source having a predetermined size and power at a first position on a work piece, an executable portion configured for varying at least one of a focus lens setting or an astigmatism lens setting for the first energy beam spot until max intensity for the first beam spot is detected, an executable portion configured for comparing at least one setting of the focus lens and/or astigmatism lens for the detected maximum intensity of the first energy beam spot with corresponding stored settings of the focus lens and/or astigmatism lens for the first energy beam spot with the predetermined size and power, an executable portion configured for repeating the generating, varying, and comparing steps for different predetermined beam powers, and an executable portion configured for repeating the generating, varying, comparing, and the repetition thereof steps for different positions on the work piece, wherein the first energy beam spot size is verified if each detected settings of the focus lens and/or astigmatism lens are deviating less than a predetermined value from corresponding stored settings of the focus lens and/or astigmatism lens.

In yet another aspect of the present invention, the non-transitory computer program product further comprises: an executable portion configured for generating a predetermined pattern on a work table with the energy beam spot while deflecting the energy beam spot with a first deflection speed; an executable portion configured for detecting first positions of the energy beam spot on the work table created with the first deflection speed; an executable portion configured for generating the predetermined pattern on a work table with the energy beam spot while deflecting the energy beam spot with a second deflection speed; an executable portion configured for detecting second positions of the energy beam spot on the work table created with the second deflection speed; and an executable portion configured for comparing the first and second positions, wherein the deflection speed is verified if each one of the first positions are deviating less than a predetermined distance from corresponding ones of the second positions.

In yet another aspect of the present invention, an apparatus for automatically verifying a size of at least one energy beam spot is provided. The apparatus comprises: a first energy beam source configured to generate a first energy beam spot having a predetermined size and power at a first position on a work piece, and a control unit. The control unit is configured to: vary at least one of a focus lens setting or an astigmatism lens setting for the first energy beam spot until max intensity for the first beam spot is detected, compare at least one setting of the focus lens and/or astigmatism lens for the detected maximum intensity of the first energy beam spot with corresponding stored settings of the focus lens and/or astigmatism lens for the first energy beam spot with the predetermined size and power, repeat the generating, varying, and comparing steps for one or more beam powers other than the predetermined beam power, and repeat the generating, varying, comparing, and the above repeating steps for one or more positions on the work piece other than the first position, wherein the first energy beam spot size is verified if each detected settings of the focus lens and/or astigmatism lens are deviating less than a predetermined value from corresponding stored settings of the focus lens and/or astigmatism lens.

In yet another aspect of the present invention, the apparatus may further comprise at least one mirror positioned in a pathway between the first energy beam source and the work piece structure, the at least one mirror being configured for, via the control unit, directing the first energy beam. The mirror may be tiltable or otherwise movable.

In yet another aspect of the present invention, the apparatus may be further configured for verifying a deflection speed of the first energy beam spot. In such embodiments, the control unit is further configured to: generate a predetermined pattern on a work table with the energy beam spot while deflecting the energy beam spot with a first deflection speed; detect first deflection positions of the energy beam spot on the work table created with the first deflection speed; generate the predetermined pattern on a work table with the energy beam spot while deflecting the energy beam spot with a second deflection speed; detect second deflection positions of the energy beam spot on the work table created with the second deflection speed; and compare the first and second deflection positions, wherein the deflection speed is verified if each one of the first deflection positions are deviating less than a predetermined distance from corresponding ones of the second deflection positions.

Generally speaking, one exemplary and non-limiting advantage of this invention is that any deviation of the size of the beam parameter that may affect the quality of the manufactured three-dimensional part may be controlled during the whole build. Any deviation larger than a predetermined value may cause a stop or a recalibration of the beam spot before the manufacturing of the three-dimensional article is continued.

BRIEF DESCRIPTION OF THE SEVERAL VIEWS OF THE DRAWINGS

Figure 1:
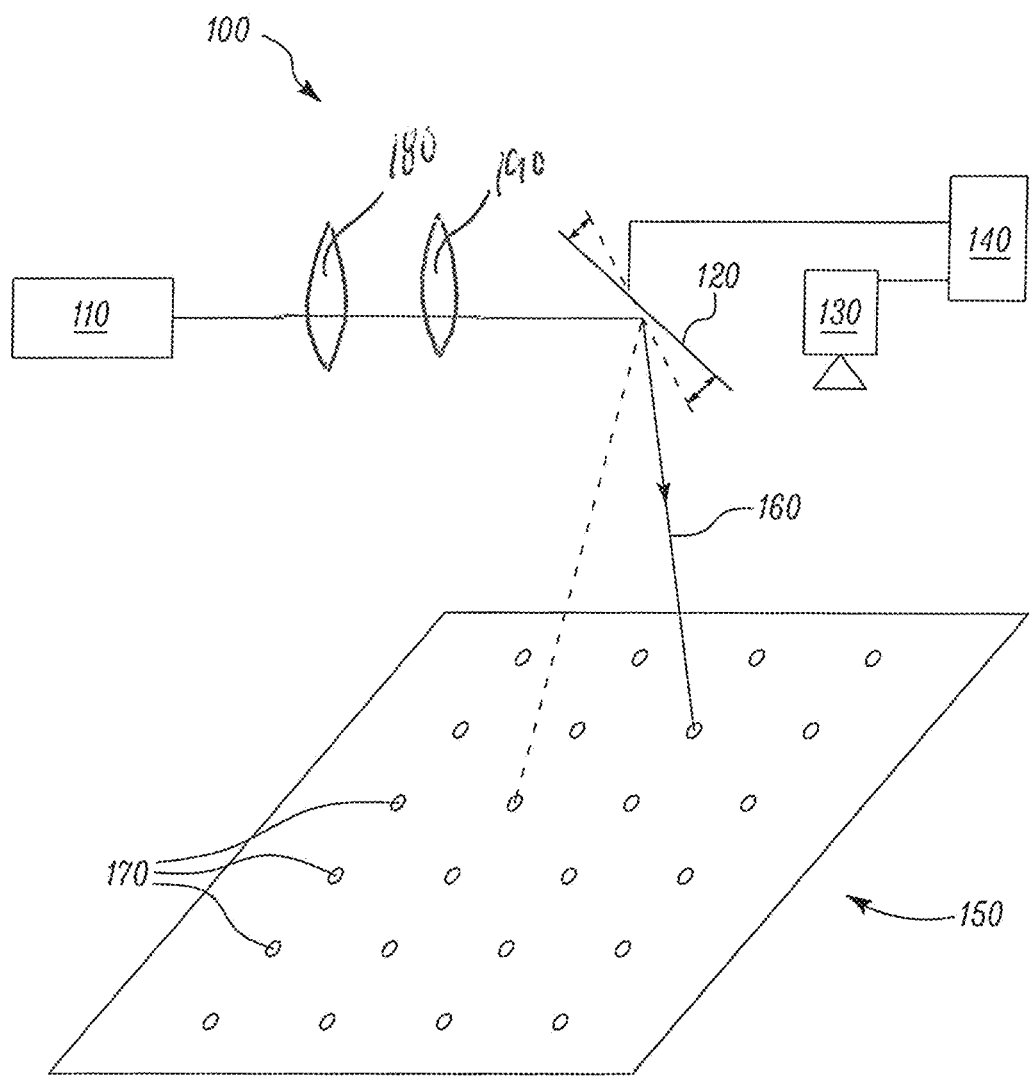
Figure 2:
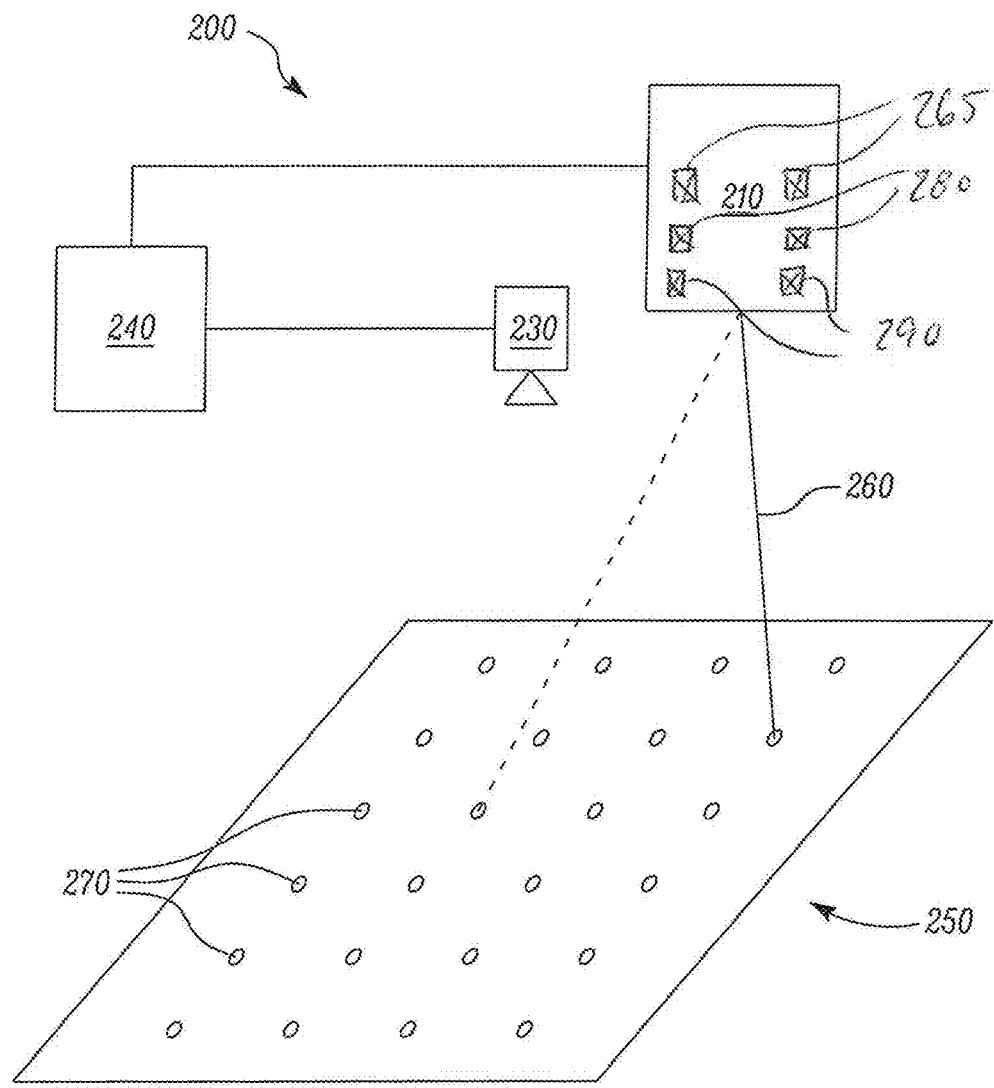
Figure 3:
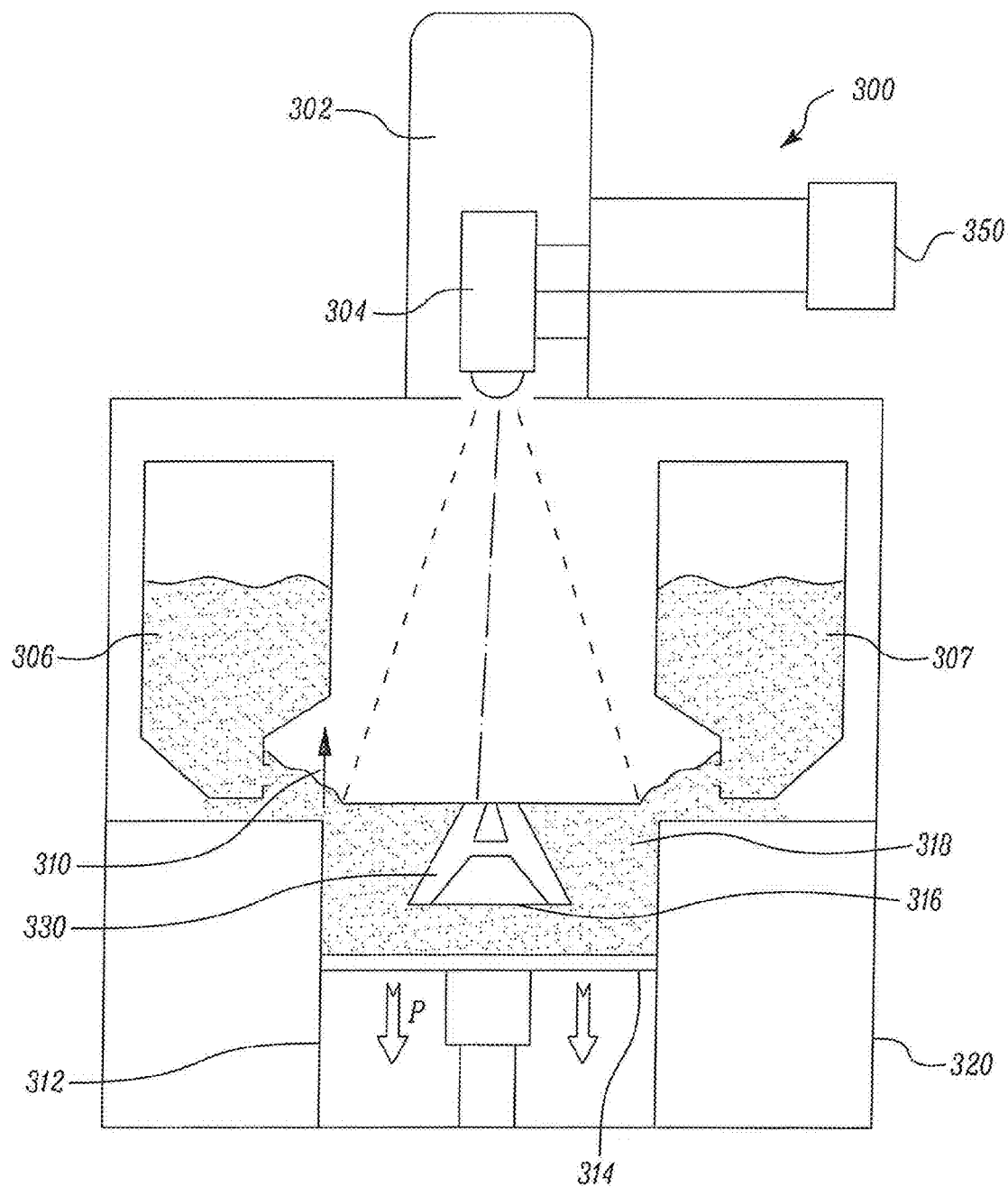
Figure 4:
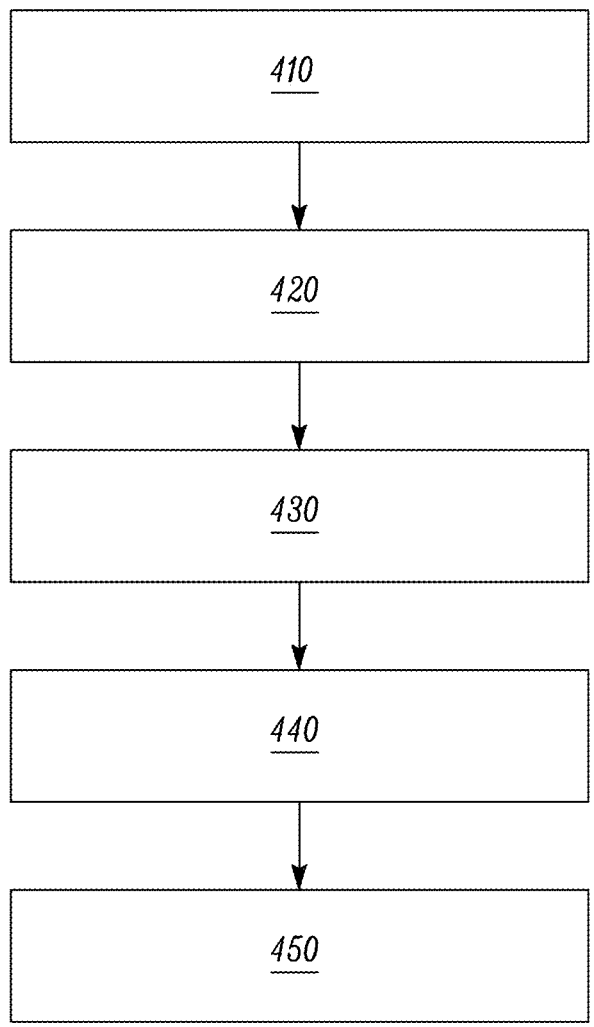
Figure 5:
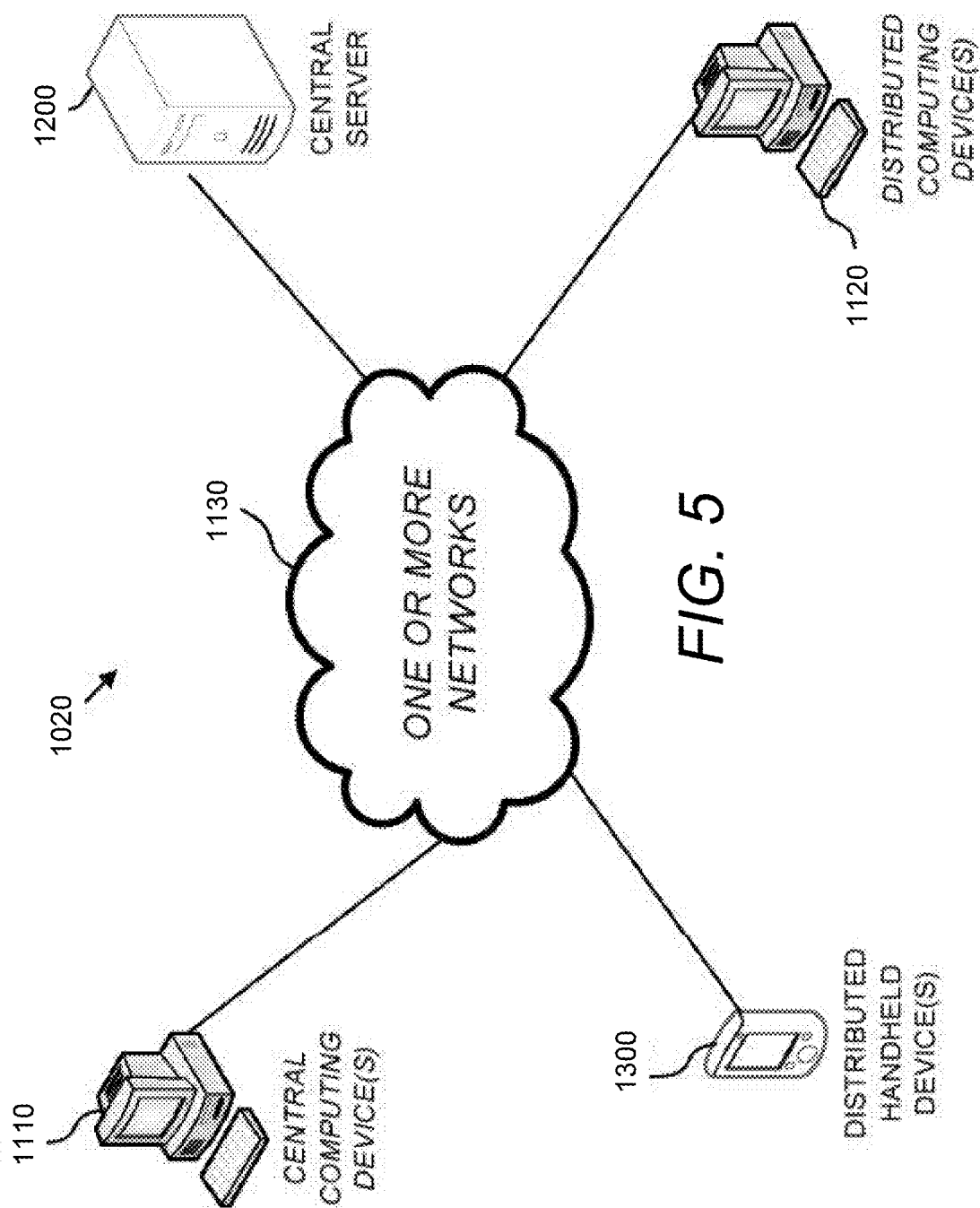
Figure 6A:
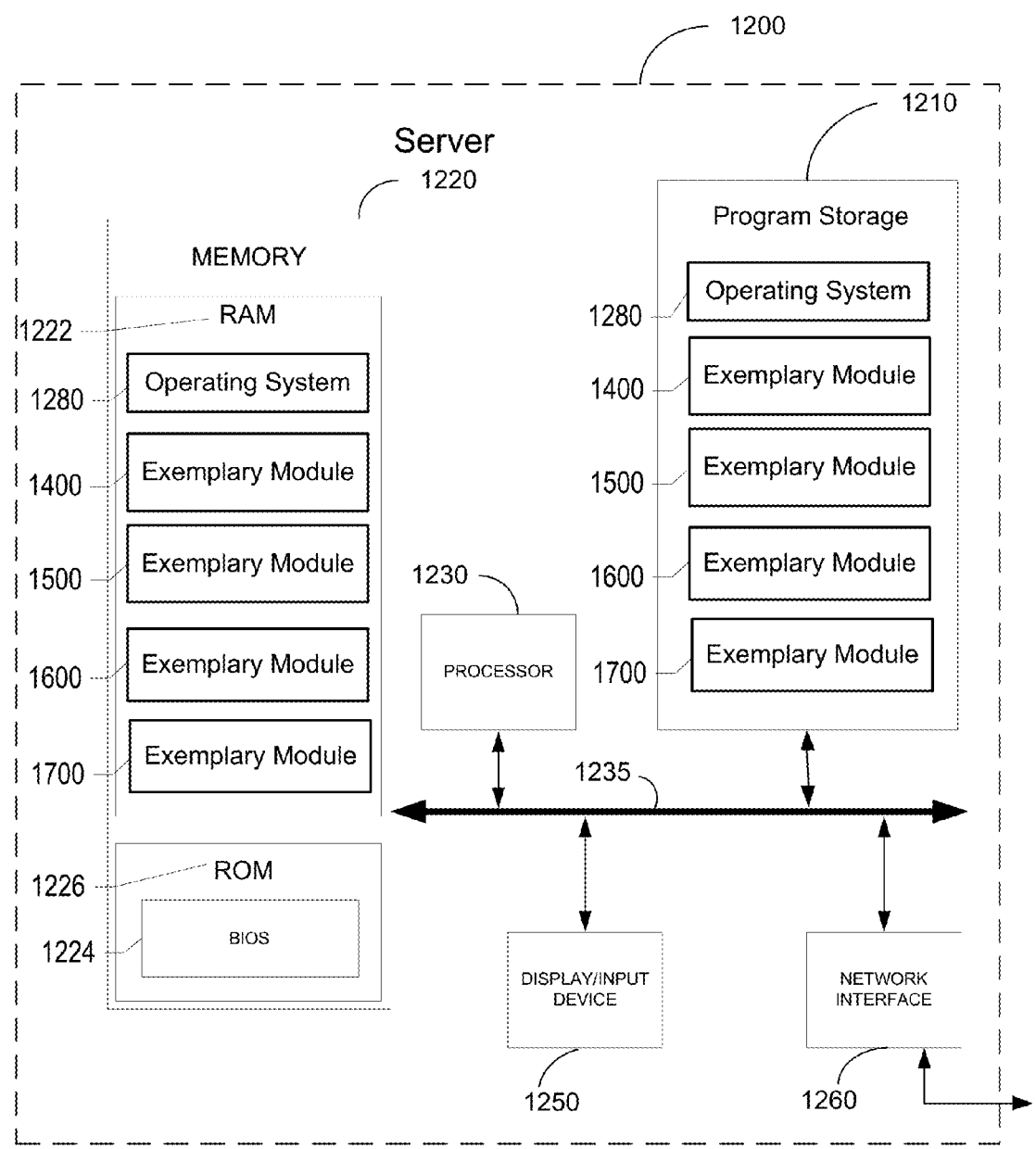
Figure 6B:
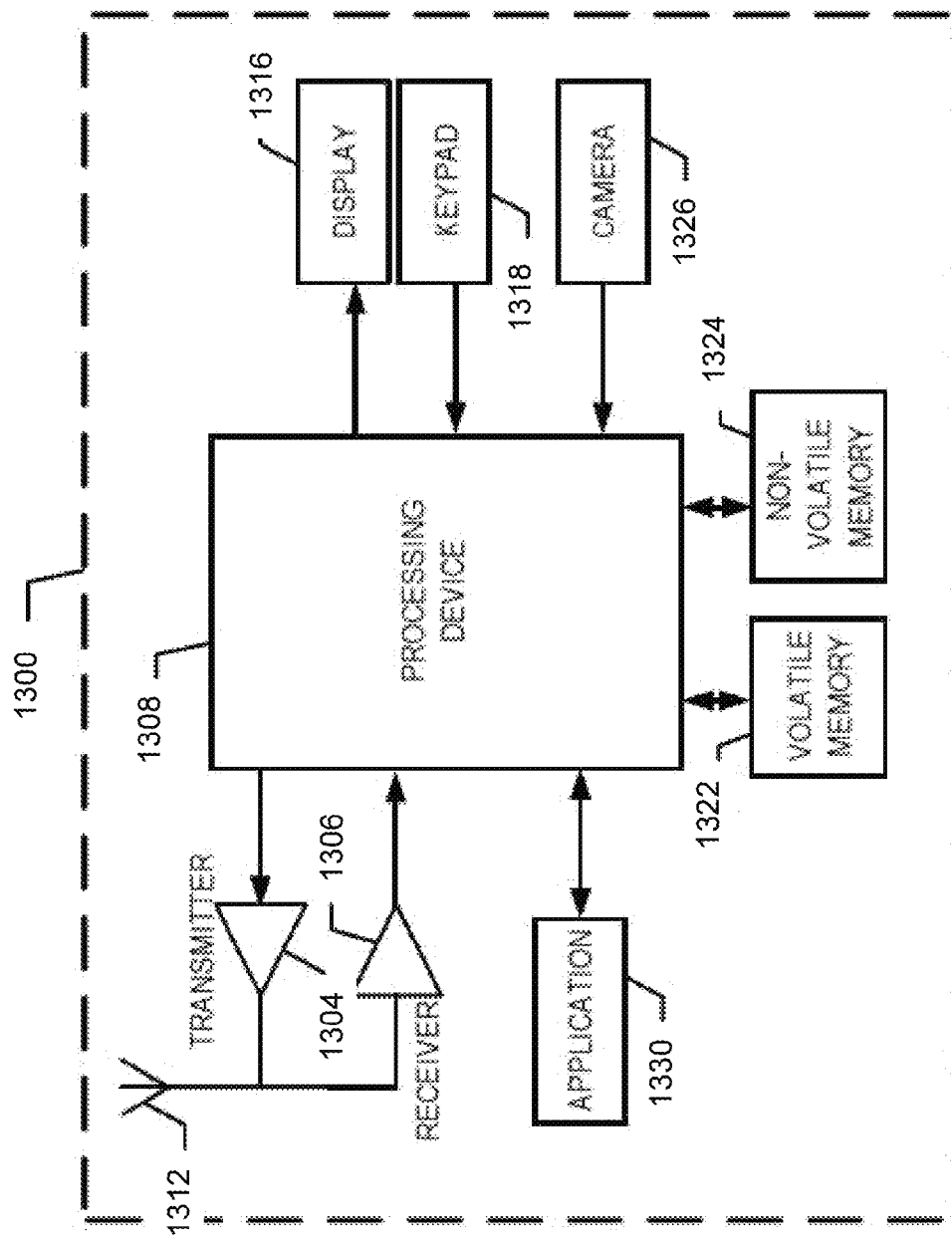

Having thus described the invention in general terms, reference will now be made to the accompanying drawings, which are not necessarily drawn to scale, and wherein:

FIG. 1 depicts a schematic perspective view of a first example embodiment of a setup for verifying the beam spot size;

FIG. 2 depicts a schematic perspective view of a second example embodiment of a setup for verifying the beam spot size;

FIG. 3 depicts an apparatus in which the inventive verifying method may be implemented;

FIG. 4 depicts a schematic flow chart of the inventive method according to an embodiment of the present invention;

FIG. 5 is a block diagram of an exemplary system 1020 according to various embodiments;

FIG. 6A is a schematic block diagram of a server 1200 according to various embodiments; and FIG. 6B is a schematic block diagram of an exemplary mobile device 1300 according to various embodiments.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

FIG. 3 depicts an example embodiment of a freeform fabrication or additive manufacturing apparatus 300 in which the inventive verification method may be implemented. The apparatus 300 in at least this embodiment comprises an electron gun 302; a camera 304; two powder hoppers 306, 307; a start plate 316; a build tank 312; a powder distributor 310; a build platform 314; and a vacuum chamber 320.

The vacuum chamber 320 is capable of maintaining a vacuum environment by means of or via a vacuum system, which system may comprise a turbomolecular pump, a scroll pump, an ion pump and one or more valves which are well known to a skilled person in the art and therefore need no further explanation in this context. The vacuum system may be controlled by a control unit 350.

The electron gun 302 is generating an electron beam which may be used for melting or fusing together powder material 318 provided on the start plate 316. The electron gun 302 may be provided in the vacuum chamber 320. The control unit 350 may be used for controlling and managing the electron beam emitted from the electron beam gun 302. At least one focusing coil (not shown), at least one deflection coil (not shown) and an electron beam power supply (not shown) may be electrically connected to the control unit 350. In an example embodiment of the invention the electron gun generates a focusable electron beam with an accelerating voltage of about 60 kV and with a beam power in the range of 0-10 kW. The pressure in the vacuum chamber may be in the range of $1\times10^{-3}$-$1\times10^{-6}$ mBar when building the three-dimensional article by fusing the powder layer by layer with the energy beam.

Instead of melting the powder material with an electron beam a laser beam may be used. The vacuum chamber may be optional when using a laser beam source instead of the electron beam source.

The powder hoppers 306, 307 comprise the powder material to be provided on the start plate 316 in the build tank 312. The powder material may for instance be pure metals or metal alloys such as titanium, titanium alloys, aluminum, aluminum alloys, stainless steel, Co—Cr—W alloy, etc.

The powder distributor 310 is arranged to lay down a thin layer of the powder material on the start plate 316. During a work cycle the build platform 314 will be lowered successively in relation to the ray gun after each added layer of powder material. In order to make this movement possible, the build platform 314 is in one embodiment of the invention arranged movably in vertical direction, i.e., in the direction indicated by arrow P. This means that the build platform 314 starts in an initial position, in which a first powder material layer of necessary thickness has been laid down on the start plate 316. A first layer of powder material may be thicker than the other applied layers. The reason for starting with a first layer which is thicker than the other layers is that one does not want a melt-through of the first layer onto the start plate. The build platform is thereafter lowered in connection with laying down a new powder material layer for the formation of a new cross section of a three-dimensional article. Means for lowering the build platform 314 may for instance be through a servo engine equipped with a gear, adjusting screws etc.

A model of the three dimensional article may be generated via a CAD (Computer Aided Design) tool.

After a first layer is finished, i.e., the fusion of powder material for making a first layer of the three-dimensional article, a second powder layer is provided on the work table 316. The second powder layer is distributed according to the same manner as the previous layer. However, there might be alternative methods in the same additive manufacturing machine for distributing powder onto the work table. For instance, a first layer may be provided by means of or via a first powder distributor, a second layer may be provided by another powder distributor. The design of the powder distributor is automatically changed according to instructions from the control unit. A powder distributor in the form of a single rake system, i.e., where one rake is catching powder fallen down from both a left powder hopper 306 and a right powder hopper 307, the rake as such can change design.

After having distributed the second powder layer on the work table 316, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

FIG. 1 depicts a schematic perspective view of a first example embodiment of a setup 100 for verifying the spot size of an energy beam. The setup 100 comprises a laser source 110, a camera 130, a control unit 140 and a work piece 150.

The laser source is used for generating a laser beam 160 which may be deflected on the work table 150 by means of or via a tiltable mirror 120. By changing the angle of the tiltable mirror the laser beam 160 may be moved at any desired position within a predetermined maximum area. The deflection speed of the laser beam may be altered by changing the speed of tilting the tiltable mirror, a slow change of tilting degree of the mirror may result in a slow deflection speed of the laser beam and a rapid change of tilting degree of the mirror may result in a rapid deflection speed of the laser beam.

An example embodiment of verifying the beam spot size may first start with determining a pattern 170 which is to be provided on the work piece 150. The pattern 170 may be one or two dimensional. The pattern 170 may be a regular pattern or an irregular pattern. The number of points chosen depends on the desired accuracy of the verification, i.e., a larger number of points may result in a higher accuracy.

The verification process may work with a perfectly flat work piece as well as with a work piece not being perfectly flat, i.e., the position of the work piece as well as the angle of the work piece may not be known prior to the verification process. However, the exact position and angle of the work piece is not a prerequisite for this verification process.

The inventive verification process may also work with a non-calibrated camera, i.e., it is not a prerequisite to know the absolute value of the maximum intensity as long as we know that the maximum intensity is achieved.

In a first step 410 according to the present invention a first beam spot is provided having a predetermined size and power at a first position on a work piece. It is a prerequisite that the beam spot focus and/or astigmatism at least once has been calibrated. The calibration of the energy beam focus and/or astigmatism can be made in several ways. In an example embodiment the calibration may be performed manually, i.e., by letting a person inspecting the beam spot manually while adjusting the settings of the focus and/or astigmatism lenses. For each position on the work piece the settings of the focus and/or astigmatism coil(s) is detected and saved in a calibration file for optimal shape and size of the beam spot. This manual calibration is repeated for a number of different energy beam powers.

The predetermined size of the beam spot may be a minimum size or any other achievable size.

In a next step according to the invention, denoted by 420 in FIG. 4, a focus and/or astigmatism lens setting is varied for the first beam spot having the predetermined beam spot size and beam power until max intensity for the beam spot is detected.

The max intensity of the energy beam may be detected by a camera 304 provided inside or outside the vacuum chamber 320. The camera 304 may be any type of camera for example an IR-camera (Infrared-camera), NIR-camera (Near Infrared-camera), a VISNIR-camera (Visual Near Infrared-camera), a CCD camera (Charged Coupled Device-camera), a CMOS-camera (Complementary Metal Oxide Semiconductor-camera), a digital camera.

In a laser based system, where a spot size of a laser beam is to be verified according to the invention, a setting of at least one focus lens 180 and/or at least one astigmatism lens 190 may be varied in order to find the maximum intensity.

The focus lens 180 may be moved along the optical axis and/or rotated around the optical axis and/or be tilted with respect to the optical axis. The astigmatism lens may be moved along the optical axis and/or rotated around the optical axis and/or be tilted with respect to the optical axis. The mechanical movement in order to find the maximum intensity of the lenses discussed above, i.e., in a laser based system, relates to classical optical lenses with a given refractive index, size and lens grinding.

Alternatively an adaptive lens/mirror may be used instead of the ordinary fixed optical lenses. Such adaptive lens/mirror may not need to me rotated, moved or tilted in order to adjust the focus and/or astigmatism. The adaptive lens may adapt its surface in order to vary its focusing and/or astigmatism properties.

FIG. 2 depicts a schematic perspective view of a second example embodiment of a setup 200 for verifying the beam spot size. The setup 200 comprises an electron beam source 210, a camera 230, a control unit 240 and a work piece 250.

The electron beam source is used for generating an electron beam 260 which may be deflected on the work table 250 by means of or via at least one deflection coil 290. By changing the magnetic field of the deflection coil 290 the electron beam 260 may be moved at any desired position within a predetermined maximum area.

The verification of the beam spot size is identical as previously described in relation to FIG. 1. The only difference between FIGS. 1 and 2 is the energy beam source and how the energy beam is deflected and how its size and shape is altered. Focus and astigmatism in the electron beam based system may be changed by altering the settings of the at least one focus coil 265 and the at least one astigmatism coil 280.

The settings of the astigmatism coil and/or the focus coil may be changed by altering the focus coil current and/or the astigmatism coil current. In FIG. 2 it is only depicted one focus coil and one astigmatism coil. In another example embodiment there may be a plurality of astigmatism coils and/or a plurality of focus coils.

In a next step, denoted by 430 in FIG. 4, at least one setting of the focus lens and/or astigmatism lens for the detected maximum intensity of the beam spot is compared with corresponding stored settings of the focus lens and/or astigmatism lens for the beam spot with the predetermined size and power. The comparison may be performed in the control unit 140, 240.

Each individual setting for each position and each beam power may be compared with stored calibrated settings for the energy beam. In the laser beam case the actual detected position, rotation and/or tilting of the astigmatism lens and/or the focus lens for the maximum intensity is compared with corresponding stored calibrated position, rotation and/or tilting of the astigmatism lens and/or the focus lens for each beam power and each position on the work piece 150, 250.

In a next step the detection of the maximum intensity and comparison of the settings of the astigmatism and/or focus lens settings with the stored calibrated settings is repeated for different beam powers denoted by 440 in FIG. 4.

Finally the detection of the maximum intensity and comparison of the settings of the astigmatism and/or focus lens settings with the stored calibrated settings is repeated for different positions on the work piece 150, 250, wherein the beam spot size is verified if each detected settings of the focus lens and/or astigmatism lens are deviating less than a predetermined value from a corresponding stored settings of the focus lens and/or astigmatism lens, denoted by 450 in FIG. 4.

In case of a deviation of a detected actual setting value from the stored calibrated setting value larger than a predetermined value a warning signal/message may be sent out. Such warning signal/message may be in the form of an audio signal and/or text message. In an alternative embodiment in case of a deviation of a detected actual setting value from the stored calibrated setting value larger than a predetermined value, a signal to shut down the energy beam may be sent out.

When detecting the settings of the energy beam, each and every beam power for a single position may first be detected before moving to another position where each and every beam power is detected. This is repeated until all positions have been detected for all beam powers.

Alternatively a first beam power is detected at all positions on the work piece. Then the beam power is changed and detected at all positions on the work piece. This is repeated until all beam powers have been detected at all positions.

The predetermined beam spot size may be a minimum spot size. Alternatively the beam spot size may be any predetermined size.

The energy beam spot may be an electron beam spot or a laser beam spot.

In various example embodiments the verification of the energy beam spot may take place on an already fused powder layer in an additive manufacturing process.

In various example embodiments the energy beam spot on the work piece may be a circular beam spot. However, any shape and size of the beam spot may be used.

The astigmatism lens and/or focus lens setting may be a coil current setting to at least one astigmatism coil and/or at least one focus coil respectively if the energy bam is an electron beam.

The astigmatism lens and/or focus lens setting may be a positioning along and/or rotation around and/or tilting at the optical axis of at least one astigmatism lens and/or at least one focus lens respectively in the case of an energy beam being a laser beam.

The positions may be detected by an IR-camera, a CCD-camera, a digital camera, a CMOS camera or a NIR-camera.

In yet another example embodiment of the present invention the method further comprising a step of sending out a warning signal/message if any one of the detected settings of the focus lens and/or astigmatism lens are deviating more than a predetermined value from corresponding stored settings of the focus lens and/or astigmatism lens.

The verifying method as described above may for instance be used in an additive manufacturing apparatus in which the energy beam spot is used for fusing powder material layerwise for forming three-dimensional articles.

In FIGS. 1 and 2 it is illustrated an example embodiment of a pattern on a work piece, which may be used for verifying the beam spot size of an energy beam. The pattern comprising 6 rows, where each row comprising 4 dots 170. The dots are meant to be generated by the energy beam 160, 260. The energy beam may produce the pattern of dots 170 in any given order. Obviously there are many alternative ways of deflecting the energy beam through each and every point in the given pattern illustrated in FIGS. 1 and 2. Any one of the dots may be chosen as start and finish point.

The surface of the work table 150, 250 may not be melted when performing the verification method. The image of the full pattern may be compiled from a number of different images taken at different times during the production of the pattern.

A laser source may be switched on and off at a given frequency, meaning that the duration of laser pulses may be fixed.

The verification of the beam spot size may be used as a control/quality feature in an additive manufacturing apparatus. If the beam spot size is determined to be out of specification a warning signal may be sent to the operator of the machine. In an alternative embodiment when the beam spot size is determined to be out of specification the additive manufacturing machine may be switched off or put in an idle state.

The predetermined allowable spot size variation may in a first example embodiment be less than 50 μm. Parts with high tolerance requirements may need smaller variations, in the range of 10-30 μm in order to be accepted and parts with low tolerance requirements may accept an offset larger than 100 μm.

In various example embodiments according to the present invention not only the spot size of one energy beam source may be verified. In various example embodiments the method may further comprising the steps of: providing a second energy beam spot from a second energy beam source having a predetermined size and power at the first position on the work piece, varying a focus and/or astigmatism lens setting for the second energy beam spot until max intensity for the second energy beam spot is detected, comparing the detected max intensity for the first energy beam spot with the detected max intensity for the second energy beam spot, wherein the first and second energy beam spot sizes are verified if the detected max intensity of the first energy beam spot is deviating less than a predetermined value from the detected max intensity of the second energy beam spot.

In a laser based system, i.e., when the energy beam source is a laser, one or a plurality of laser beam sources may start to provide a distorted laser beam spot for various reasons. For instance one or a plurality of optical lenses and/or mirrors in the laser optical system may be ablated. In an electron beam based system the electron filament may be ablated and/or its shape may be varied during operation. It is advantageous in for example an additive manufacturing process to be able to monitor the energy beam quality even during an ongoing build since the energy beam specification may ran out of tolerances at any given time. If not detecting an energy beam with one or a plurality of its characteristic values out of specification, the additive manufacturing build may be erroneous. On the other hand, if the energy beam is detected to be out of specification during the additive manufacturing of a three-dimensional article, the energy beam may be corrected to fall within predetermined tolerances again and thereby possibly not destroy the material characteristics of the additively manufactured article.

In various example embodiments the first and second energy beam spots from the first and second energy beam sources respectively may have equal maximum beam spot power. By using different energy beam sources with equal maximum output power, the reliability of the verification result may be improved. This is because a synchronization step for achieving a specific beam power of the first and second energy beam may be eliminated.

In various example embodiments, the method may further comprise the steps of providing the first energy beam spot at the first position during a first predetermined time duration, where a first intensity is detected, providing the first energy beam spot at the first position during a second predetermined time duration where a second intensity is detected. Calculating a ratio between the first and second intensities, wherein the first energy beam spot size and/or beam spot power is verified if the calculated ratio between the first and second intensities is deviating less than a predetermined value from a corresponding calibrated ratio of the first beam with the first and second time durations.

In various example embodiments, the method may be configured to not only verify the size of the beam spot, but to also verify a deflection speed of the same, in a consolidated fashion.

By varying the time duration a specific energy beam spot is impinging onto a predetermined surface area, specific maximum beam intensities may be detected. A ratio between detected maximum intensities detected for a predetermined time duration may be compared with corresponding values for the energy beam spot when the energy beam spot was calibrated. This may be an efficient an accurate method of quickly be provided with an indication of any disturbances in the optical system. It is highly unlikely that any beam power deviation may result in an equal linear behavior of maximum intensities for different detected time durations as when the beam was calibrated. This may be more evident the more ratios are calculated for different beam powers and/or different time durations.

In an additive manufacturing process the first position of the first and/or the second energy beam on the work piece may be located in an overlap area where the first and second energy beams may simultaneously or consecutively fusing the powder material.

In another aspect of the invention it is provided a program element configured and arranged when executed on a computer to implement a method as described herein. The program element may be installed in a computer readable storage medium. The computer readable storage medium may be any one of the control units 140, 240, and/or 350, as described elsewhere herein. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (Fe-RAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 5 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 5 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 1130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 1130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 5 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

FIG. 6A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server

1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 6B provides an illustrative schematic representative of a mobile device 1300 that can be used in conjunction with various embodiments of the present invention. Mobile devices 1300 can be operated by various parties. As shown in FIG. 6B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1xRTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

The invention is not limited to the above-described embodiments and many modifications are possible within the scope of the following claims. Such modifications may, for example, involve using a different source of energy beam than the exemplified electron beam such as a laser beam. Other materials than metallic powder may be used, such as the non-limiting examples of: electrically conductive polymers and powder of electrically conductive ceramics. Images taken from more than 2 layers may also be possible, i.e., in an alternative embodiment of the present invention for detecting a defect at least one image from at least three, four or more layers are used. A defect may be detected if the defect position in the three, four or more layers are at least partly overlapping each other. The thinner the powder layer the more powder layers may be used in order to detect a factual defect.

Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be understood that the invention is not limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A computer program product comprising at least one non-transitory computer readable medium having stored thereon computer-readable program code portions, the computer-readable program code portions comprising one or more executable portions configured for:
   (a) generating a first energy beam spot from a first energy beam source, the first energy beam spot having a predetermined size and power at a first position on a work piece,
   (b) varying at least one of a focus lens setting or an astigmatism lens setting for said first energy beam spot until a maximum intensity of the first energy beam spot is detected,
   (c) comparing at least one setting of said focus lens and/or astigmatism lens associated with said detected maximum intensity of the first energy beam spot with corresponding stored settings of said focus lens and/or astigmatism lens associated with said predetermined size and power of the first energy beam spot, the stored settings being stored within a memory,
   (d) repeating steps a-c for different predetermined beam powers, and
   (e) repeating steps a-d for different positions on said work piece, and verifying said first energy beam spot size by verifying that each settings of said focus lens and/or astigmatism lens settings associated with the detected maximum intensity deviate less than a predetermined value from the corresponding stored settings of said focus lens and/or astigmatism lens.

2. The computer program product of claim 1, wherein said predetermined energy beam spot size is a minimum spot size.

3. The computer program product of claim 1, wherein the repeating step for different positions is performed before the repeating step for different predetermined beam powers.

4. The computer program product of claim 1, wherein the first energy beam spot is an electron beam spot.

5. The computer program product of claim 4, wherein said astigmatism lens and/or focus lens settings comprise a coil current setting to at least one astigmatism coil and/or at least one focus coil respectively.

6. The computer program product of claim 1, wherein the first energy beam spot is a laser beam spot.

7. The computer program product of claim 6, wherein said astigmatism lens and/or focus lens settings comprise a positioning along an optical axis of at least one astigmatism lens and/or at least one focus lens respectively.

8. The computer program product of claim 1, wherein the one or more executable portions are further configured for sending a warning signal/message when any one of said settings of said focus lens and/or astigmatism lens associated with the detected maximum intensity deviate more than a predetermined value from the corresponding stored settings of said focus lens and/or astigmatism lens.

9. The computer program product of claim 1, wherein the one or more executable portions are further configured for:
   providing a second energy beam spot from a second energy beam source, the second energy beam spot having a predetermined size and power at said first position on said work piece,
   varying a focus and/or astigmatism lens setting for said second energy beam spot until a maximum intensity for said second energy beam spot is detected, and
   comparing said detected maximum intensity for said first energy beam spot with said detected maximum intensity for said second energy beam spot, and verifying said first and second energy beam spot sizes by verifying that said detected maximum intensity of said first energy beam spot deviates less than a predetermined value from said detected maximum intensity of said second energy beam spot.

10. The computer program product of claim 9, wherein said first and second energy beam spots have equal maximum beam spot powers.

11. The computer program product of claim 1, wherein the one or more executable portions are further configured for:
   providing said first energy beam spot at said first position during a first predetermined time duration where a first intensity is detected,
   providing said first energy beam spot at said first position during a second predetermined time duration where a second intensity is detected, and
   calculating a ratio between said first and second intensities, and verifying said first energy beam spot size and/or beam spot power by verifying that said calculated ratio between said first and second intensities deviates less than a predetermined value from a corresponding calibrated ratio of said first beam energy spot with said first and second time durations.

12. The computer program product of claim 11, wherein the steps recited therein are repeated for different beam powers and/or time durations.

13. The computer program product of claim 1, wherein the one or more executable portions are further configured for receiving and storing, within one or more memory storage areas, a model of at least one three-dimensional article.

14. The computer program product of claim 1, the one or more executable portions are configured for verifying a deflection speed of the first energy beam spot by:

generating a predetermined pattern on a work table with said first energy beam spot while deflecting said first energy beam spot with a first deflection speed;

detecting first positions of said first energy beam spot on said work table created with said first deflection speed;

generating said predetermined pattern on the work table with said first energy beam spot while deflecting said first energy beam spot with a second deflection speed;

detecting second positions of said first energy beam spot on said work table created with said second deflection speed; and comparing said first and second positions, verifying that each one of said first positions deviate less than a predetermined distance from corresponding ones of said second positions.

15. The computer program product of claim 1, wherein the first position is detected via utilization of at least one of an IR-camera, a CCD-camera, a digital camera, a CMOS camera, or a NIR-camera.

16. A non-transitory computer readable medium having stored thereon a program element configured and arranged when executed on a computer to implement a method for automatically verifying a size of at least one energy beam spot, said method comprising the steps of:

(a) generating a first energy beam spot from a first energy beam source, the first energy beam spot having a predetermined size and power at a first position on a work piece, (b) varying at least one of a focus lens setting or an astigmatism lens setting for said first energy beam spot until a maximum intensity of the first energy beam spot is detected, (c) comparing at least one setting of said focus lens and/or astigmatism lens associated with said detected maximum intensity of the first energy beam spot with corresponding stored settings of said focus lens and/or astigmatism lens associated with said predetermined size and power of the first energy beam spot, the stored settings being stored within a memory, (d) repeating steps a-c for different predetermined beam powers, and (e) repeating steps a-d for different positions on said work piece, and verifying said first energy beam spot size by verifying that each settings of said focus lens and/or astigmatism lens settings associated with the detected maximum intensity deviate less than a predetermined value from the corresponding stored settings of said focus lens and/or astigmatism lens.

17. The non-transitory computer readable medium of claim 16, wherein the first position is detected via utilization of at least one of an IR-camera, a CCD-camera, a digital camera, a CMOS camera, or a NIR-camera.

18. The non-transitory computer readable medium of claim 16, wherein the program element is further configured and arranged when executed on a computer to implement a method for verifying a deflection speed of the first energy beam spot by:

generating a predetermined pattern on a work table with said first energy beam spot while deflecting said first energy beam spot with a first deflection speed;

detecting first positions of said first energy beam spot on said work table created with said first deflection speed;

generating said predetermined pattern on the work table with said first energy beam spot while deflecting said first energy beam spot with a second deflection speed;

detecting second positions of said first energy beam spot on said work table created with said second deflection speed; and comparing said first and second positions, verifying that each one of said first positions deviate less than a predetermined distance from corresponding ones of said second positions.

19. The non-transitory computer readable medium of claim 16, wherein the method for automatically verifying a size of at least one energy beam spot further comprises:

providing said first energy beam spot at said first position during a first predetermined time duration where a first intensity is detected, providing said first energy beam spot at said first position during a second predetermined time duration where a second intensity is detected, and calculating a ratio between said first and second intensities, and verifying said first energy beam spot size and/or beam spot power by verifying that said calculated ratio between said first and second intensities deviates less than a predetermined value from a corresponding calibrated ratio of said first beam energy spot with said first and second time durations.

20. The non-transitory computer readable medium of claim 19, wherein the steps recited therein are repeated for different beam powers and/or time durations.

* * * * *